(12) United States Patent
Nakamura et al.

(10) Patent No.: US 8,372,204 B2
(45) Date of Patent: *Feb. 12, 2013

(54) SUSCEPTOR FOR MOCVD REACTOR

(75) Inventors: Shuji Nakamura, Santa Barbara, CA (US); Steven DenBaars, Goleta, CA (US); Max Batres, Santa Barbara, CA (US); Michael Coulter, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/483,387

(22) Filed: Jul. 6, 2006

(65) Prior Publication Data

US 2006/0269390 A1    Nov. 30, 2006

Related U.S. Application Data

(63) Continuation of application No. 10/144,943, filed on May 13, 2002, now Pat. No. 7,122,844.

(51) Int. Cl.
*H01L 21/00* (2006.01)
*C23C 14/00* (2006.01)
*C23C 16/00* (2006.01)

(52) U.S. Cl. .................. 118/725; 118/724; 118/728

(58) Field of Classification Search .......... 118/728–732, 118/725; 156/345.51–345.5
See application file for complete search history.

(56) References Cited

U.S. PATENT DOCUMENTS

| | | | |
|---|---|---|---|
| 4,732,110 A * | 3/1988 | Parsons | 118/719 |
| 5,284,519 A | 2/1994 | Gadgil | 118/719 |
| 5,354,412 A | 10/1994 | Suzuki et al. | 117/99 |
| 5,356,476 A | 10/1994 | Foster et al. | 118/725 |
| 5,370,739 A | 12/1994 | Foster et al. | 118/725 |
| 5,458,689 A | 10/1995 | Saito | 118/724 |
| 5,584,936 A * | 12/1996 | Pickering et al. | 118/728 |
| 5,688,331 A | 11/1997 | Aruga et al. | 118/725 |
| 5,738,165 A | 4/1998 | Imai | 165/80.2 |
| 5,782,979 A * | 7/1998 | Kaneno et al. | 118/500 |
| 5,788,777 A | 8/1998 | Burk, Jr. | 118/730 |
| 5,817,406 A | 10/1998 | Cheung et al. | 428/210 |
| 5,938,850 A * | 8/1999 | Arami et al. | 118/715 |
| 6,001,183 A | 12/1999 | Gurary et al. | 118/720 |

(Continued)

FOREIGN PATENT DOCUMENTS

| | | |
|---|---|---|
| DE | 19934336 A1 * | 3/2000 |
| DE | 10132448 A | 1/2003 |

(Continued)

OTHER PUBLICATIONS

Parsons, J.D. "Inverted-Vertical ONVPE Reactor: Design and Characterization", Journal of Crystal Growth, North-Holland Publishing Co. Amsterdam, NL. vol. 116, No. 3/4 , Feb. 1, 1992, pp. 387-396. XP000265338, ISSN: 0022-0248 p. 387-p. 389; Figures 1-3.

(Continued)

*Primary Examiner* — Ram N. Kackar
(74) *Attorney, Agent, or Firm* — Koppel, Patrick, Heybl & Philpott

(57) ABSTRACT

A susceptor for holding semiconductor wafers in an MOCVD reactor during growth of epitaxial layers on the wafers is disclosed. The susceptor comprises a base structure made of a material having low thermal conductivity at high temperature, and has one or more plate holes to house heat transfer plugs. The plugs are made of a material with high thermal conductivity at high temperatures to transfer heat to the semiconductor wafers. A metalorganic chemical vapor deposition reactor is also disclosed utilizing a susceptor according to the present invention.

16 Claims, 5 Drawing Sheets

U.S. PATENT DOCUMENTS

| | | | | |
|---|---|---|---|---|
| 6,090,211 A | * | 7/2000 | Kamei et al. | 118/725 |
| 6,099,650 A | | 8/2000 | Carbonaro et al. | 118/715 |
| 6,151,447 A | | 11/2000 | Moore et al. | 392/418 |
| 6,153,012 A | * | 11/2000 | Rupp et al. | 118/715 |
| 6,217,662 B1 | | 4/2001 | Kong et al. | 118/725 |
| 6,257,881 B1 | | 7/2001 | Fiala et al. | 432/250 |
| 6,534,748 B1 | | 3/2003 | Zinman et al. | 219/390 |
| 8,133,322 B2 | | 3/2012 | Nakamura et al. | |
| 2001/0004880 A1 | | 6/2001 | Cho et al. | |
| 2001/0027970 A1 | | 10/2001 | Li et al. | |
| 2001/0052324 A1 | * | 12/2001 | Rupp et al. | 118/728 |
| 2002/0083899 A1 | | 7/2002 | Komeno et al. | |
| 2004/0175939 A1 | | 9/2004 | Nakamura et al. | |

FOREIGN PATENT DOCUMENTS

| | | | |
|---|---|---|---|
| EP | 0106637 A1 | * | 4/1984 |
| EP | 414038 A2 | | 8/1990 |
| EP | 0447031 A | | 9/1991 |
| EP | 0519608 A | | 12/1992 |
| FR | 1462335 A | | 12/1966 |
| JP | 56-073694 | | 6/1981 |
| JP | 62-023108 | | 1/1987 |
| JP | 63-018618 | | 1/1988 |
| JP | 63096911 A | * | 4/1988 |
| JP | 01-300516 | | 12/1989 |
| JP | 04-186823 | | 7/1992 |
| JP | 06-120145 | | 4/1994 |
| JP | 07-153696 | | 6/1995 |
| JP | 08067596 A | | 3/1996 |
| JP | 08-139028 | | 5/1996 |
| JP | 09-063967 | | 3/1997 |
| JP | 09-321034 | | 12/1997 |
| JP | 10-068079 | | 3/1998 |
| JP | 04-128379 | | 4/1998 |
| JP | 10-144773 | | 5/1998 |
| JP | 2000031064 A | | 1/2000 |
| JP | 2000-091246 | | 3/2000 |
| JP | 2002-124479 | | 4/2002 |
| WO | WO0218672 A | | 3/2002 |
| WO | WO03029516 A | | 4/2003 |
| WO | WO03098667 A | | 11/2003 |

OTHER PUBLICATIONS

Arai, T. at al. Highly Uniform Growth in a Low-Pressure MOVPE Multiple Wafer System: Journal of Crystal Growth, North-Holland Publishing Co. Amsterdam, N. vol. 170, No. 1-4, 1997, p. 88-91, XP004087082, ISSN: 0022-0248 p. 88-89; Figure 1.

Patent Abstracts of Japan, vol. 2000, No. 04, Aug. 31, 2000 and JP 2000 031064 A. Jan. 28, 2000.

Holstein, "Modeling of Chimney CVD Reactors", Journal of Crystal Growth 125, pp. 311-319, (1992).

Decision on Rejection for related Chinese Patent Application No. 03816420.5, Dated: Jun. 5, 2009.

Official Notice of Rejection regarding related Japanese Patent Application No. 2004-506067, dated Apr. 28, 2009.

Patent Abstracts of Japan, Publication No. 10-144773, Date: May 29, 1998.

Patent Abstracts of Japan, Publication No. 06-120145, Date: Apr. 28, 1994.

Patent Abstracts of Japan, Publication No. 2002-124479, Date: Apr. 26, 2002.

Patent Abstracts of Japan, Publication No. 09-050965, Date: Feb. 18, 1997.

Patent Abstracts of Japan, Publication No. 07-058041, Date: Mar. 3, 1995.

Official Notice of Final Decision of Rejection, dated: Feb. 24, 2009 for related Japan Patent Application and Comments, Mar. 24, 2009, pp. 1-2.

Patent Abstracts of Japan, Publication No. 04-128379, Pub. date: Apr. 28, 1992.

Official Notice of Rejection and Comments, Dated: Aug. 1, 2008, Japanese Application 2003-532724.

Patent Abstracts of Japan, Publication No. 56-073694, Date: Jun. 18, 2981.

Patent Abstracts of Japan, Publication No. 09-063967, Date: Mar. 7, 1997.

Patent Abstracts of Japan, Publication No. 62-023108, Date: Jan. 31, 1987.

Patent Abstracts of Japan, Publication No. 01-300516, Date: Dec. 5, 1989.

Patent Abstracts of Japan, Publication No. 05-047666, Date: Feb. 26, 1993.

Related Office Action re Taiwan Application No. 091122351, dated Nov. 20, 2008.

Office Action of the Ipo for related Taiwan Patent Application No. 091122351, dated: Nov. 20, 2008.

Official Notice of Decision to Decline the Amendment and Final Decision of Rejection for related Japanese Application No. 2004-506067, dated: Jan. 20, 2010.

Related Official Notice of Rejection from Japanese Application No. 2004-506067, dated Aug. 21, 2009.

Patent Abstracts of Japan, Publication No. 07-176482, publication date: Jul. 24, 1995.

Patent Abstracts of Japan, Publication No. 63-018618, publication date: Jan. 26, 1988.

Patent Abstracts of Japan, Publication No. 06-104193, publication date: Apr. 5, 1994.

From related application: European Patent Application No. 02 776 040.4 Office Action dated Jan. 7 2010.

Office Action from related U.S. Appl. No. 10/144,943, dated: Mar. 31, 2003.

Response to Office Action of related U.S. Appl. No. 10/144,943, dated: Jun. 30, 2003.

Office Action from related U.S. Appl. No. 10/144,943, dated: Nov. 24, 2003.

Response to Office Action of related U.S. Appl. No. 10/144,943, dated: Feb. 20, 2004.

Office Action from related U.S. Appl. No. 10/144,943, dated: May 20, 2004.

Response to Office Action of related U.S. Appl. No. 10/144,943, dated: Aug. 20, 2004.

Office Action from related U.S. Appl. No. 10/144,943, dated: Jul. 27, 2005.

Response to Office Action of related U.S. Appl. No. 10/144,943, dated: Oct. 27, 2005.

Office Action from related U.S. Appl. No. 10/144,943, Dated: Jan. 12, 2006.

Response to Office Action of related U.S. Appl. No. 10/144,943, dated: Jun. 12, 2006.

Notice of Allowance from related U.S. Appl. No. 10/144,943, dated: Jul. 3, 2006.

Office Action from related U.S. Appl. No. 10/382,198, dated: Jun. 16, 2005.

Response to related office action U.S. Appl. No. 10/382,198, dated: Oct. 14, 2005.

Office Action from related U.S. Appl. No. 10/382,198, dated: Dec. 30, 2005.

Response to related office action U.S. Appl. No. 10/382,198, dated: May 1, 2006.

Office Action from related U.S. Appl. No. 10/382,198, dated: Jul. 21, 2006.

Response to related office action U.S. Appl. No. 10/382,198, dated: Dec. 21, 2006.

Office Action from related U.S. Appl. No. 10/382,198, dated: Feb. 7, 2007.

Response to related office action U.S. Appl. No. 10/382,198, dated: Jul. 9, 2007.

Office Action from related U.S. Appl. No. 10/382,198, dated: Aug. 23, 2007.

Response to related office action U.S. Appl. No. 10/382,198, dated: Jan. 23, 2008.

Office Action from related U.S. Appl. No. 10/382,198, dated: May 30, 2008.

Response to related office action U.S. Appl. No. 10/382,198, dated: Dec. 1, 2008.

Office Action from related U.S. Appl. No. 10/382,198, dated: Feb. 18, 2009.

Response to related office action U.S. Appl. No. 10/382,198, dated: May 15, 2009.
Office Action from related U.S. Appl. No. 10/382,198, dated: Jul. 20, 2009.
Response to related office action U.S. Appl. No. 10/382,198, dated: Sep. 20, 2009.
Office Action from related U.S. Appl. No. 10/382,198, dated: Nov. 27, 2009.
Response to related office action U.S. Appl. No. 10/382,198, dated: Mar. 1, 2010.
Appeal Decision No. 2009-10287 from Japanese Patent Application No. 2003-532724 dated Aug. 16, 2011.
Office Action from U.S. Appl. No. 10/382,198, dated: Aug. 6, 2010.
Response to Office Action from U.S. Appl. No. 10/382,198, filed Jan. 4, 2011.
Office Action from U.S. Appl. No. 10/256,814, dated: Sep. 20, 2010.
Response to Office Action from U.S. Appl. No. 10/256,814, filed Dec. 13, 2010.
Office Action from U.S. Appl. No. 10/256,814, dated: Feb. 2, 2011.
Office Action from U.S. Appl. No. 10/382,198, dated: Mar. 16, 2011.
Office Action in European Patent Application No. 02776040 dated Sep. 1, 2010.
Interrogatory in Appeal 2009-10287 in Japanese Patent Application No. 2003-532724 issued Oct. 1, 2010.
Preliminary Examination Report in Appeal 2009-010287 in Japanese Patent Application No. 2003-532724 dated Dec. 4, 2009.
Office Action in European Patent Application No. 02776040 dated Feb. 14, 2011.
Interrogatory in Japanese Appeal No. 2010-008611 from counterpart Japanese Application No. 2004-506067 issued Mar. 29, 2011.
Preliminary Examination Report in Japanese Appeal No. 2010-008611 from counterpart Japanese Application No. 2004-506067.
Office Action from U.S. Appl. No. 10/256,814, dated: Aug. 10, 2011.
Response to Office Action from U.S. Appl. No. 10/256,814, filed Oct. 10, 2011.
Notice of Allowance from U.S. Appl. No. 10/256,814, dated: Nov. 2, 2011.
Office Action from U.S. Appl. No. 10/382,198, dated: Oct. 6, 2011.
Communication pursuant to Article 94(3) EPC, Application No. 02 776 040.4-2122, dated Sep. 26, 2011.
Notice of Rejection from Patent Application No. 2004-506067, dated Sep. 7, 2011.
Office Action from U.S. Appl. No. 10/382,198, dated: Feb. 13, 2012.
Substantive Examination and Search Report from Malaysian Application No. PI 20023618, dated May 15, 2012.
Notice of Allowance and Allowed Claims from Japanese Patent Application No. 2004-506067.

* cited by examiner (Exploded)

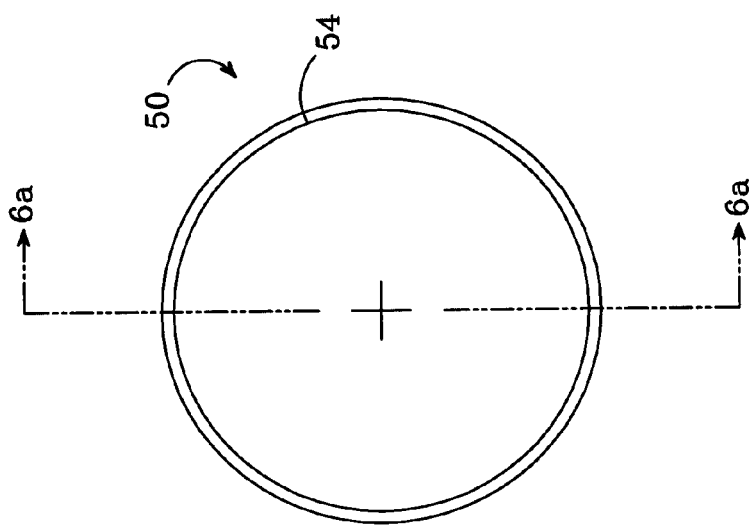
FIG.5
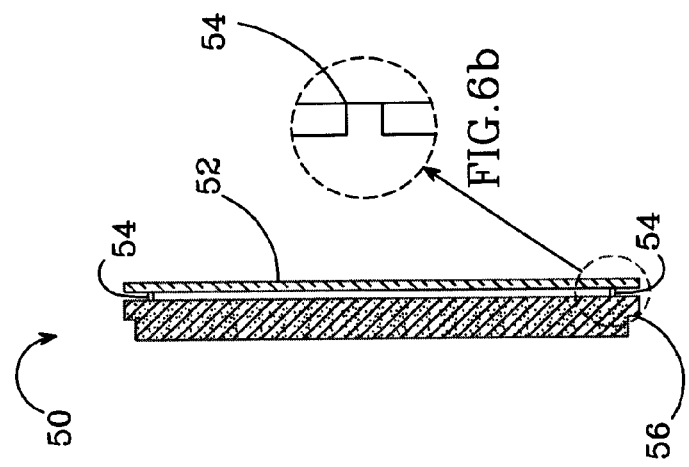
FIG.6a
FIG.6b

SUSCEPTOR FOR MOCVD REACTOR

This application is a continuation and claims the benefit of U.S. patent application Ser. No. 10/144,943 to Nakamura et al., filed May 13, 2002 now U.S. Pat. No. 7,122,844

BACKGROUND OF THE INVENTION

1. Field of the Invention

This invention relates to metalorganic chemical vapor deposition (MOCVD) reactors and more particularly to susceptors used in MOCVD reactors.

2. Description of the Related Art

Growth of gallium nitride (GaN) based semiconductor devices in MOCVD reactors is generally described in DenBaars and Keller, *Semiconductors and Semimetals*, Vol. 50, Academic Press Inc., 1997, p. 11-35. MOCVD is a nonequilibrium growth technique that relies on vapor transport of the precursers and subsequent reactions of group III alkyls and group V hydrides in a heated zone. Growth gasses and dopants are supplied to the reactor and are deposited as epitaxial layers on a substrate or wafer. One or more wafers usually rest on a structure of graphite called a susceptor that can be heated by a radio frequency (RF) coil, resistance heated, or radiantly heated by a strip lamp or coil heater. During the growth process, the heated susceptor heats the wafers.

FIG. 1 shows a conventional susceptor 10 that is used in MOCVD reactors such as those provided by Thomas Swan Scientific Equipment Limited. It has a hollowed cylindrical shape and is mounted over the reactor's heating element at the bottom of the reactor, below the source gas inlet. It has a circular base plate 12 and cylindrical sleeve 13, with the circular plate 12 having a series of disk shaped depressions 14 equally spaced around the susceptor's longitudinal axis. Each of the depressions 14 can hold a semiconductor wafer during growth. When the susceptor 10 is heated by the heating element the semiconductor wafers are also heated. When source gases enter the MOCVD reactor, they combine and then deposit on the heated semiconductor wafers as epitaxial layers. The susceptor 10 can typically spin at speeds in the range of 1,000 to 2,000 rpm, which results in more uniform epitaxial layers on the wafers.

Conventional susceptors 10 are usually formed from a monolithic structure of graphite or coated graphite that absorbs heat from the heater element and conducts it to the wafers in contact with the susceptor 10. The entire susceptor 10 is heated uniformly to achieve consistent growth conditions across the surfaces of the wafers. During fabrication of the epitaxial layers, materials will not only deposit on the heated wafer, but will also deposit on the heated susceptor 10. This can cause deposition of significant amounts of GaN, InGaN, AlInGaN, and similar compounds on the susceptor surfaces. The result is a buildup of reaction deposits on the susceptor that can adversely impact subsequent fabrication steps. For instance, the deposits can act as impurities during subsequent growth of the epitaxial layers and can also result in poor interface transition between different layers. For example, if a layer using an indium source gas was grown, indium can be deposited on the susceptor. Though the next layer to be grown does not include indium, indium from the susceptor surfaces can be included in the transition between layers. These impurities can cause poor device performance and can prevent consistent reproduction of semiconductor devices on the wafer.

Another disadvantage of conventional susceptors is that the heating element heats the entire susceptor, not just the areas under or around the wafers. This requires large amounts of heat because the susceptor has a relatively large surface area in comparison to the wafers. Most of the energy is wasted by not heating the wafers. This taxes the heater, contributing to early heater failures. Also, more reactants are consumed due to the fact that the entire susceptor is at a temperature sufficient for chemical vapor deposition.

Another disadvantage of conventional susceptors is that they are difficult to manufacture. They must be machined from a large section of graphite and if any part of the susceptor is damaged the entire structure can be unusable. The fabrication of the depressions can be extremely difficult because they are off set from the structure's longitudinal axis. The depressions cannot be machined using a simple lathe, but must involve more complex processes. For the same reasons it is very difficult to modify the shape of the surface of the depressions to compensate for temperature non-uniformity.

SUMMARY OF THE INVENTION

The present invention discloses a susceptor for holding semiconductor wafers in a reactor during growth of epitaxial layers on the wafers. The susceptor comprises a base structure having a base plate and a sleeve that are both made of a material having low thermal conductivity at high temperature. The base plate has one or more plate holes. One or more heat transfer plugs are also included, with each plug housed within a respective one of the one or more plate holes. The heat transfer plugs are made of a material with high thermal conductivity at high temperatures to transfer heat to the semiconductor wafers.

The present invention also discloses a reactor for growing epitaxial layers on semiconductor wafers, including a reactor chamber housing a heating element and susceptor. The susceptor holds the semiconductor wafers and is arranged over the heater element. The susceptor comprises a base structure having a base plate and a sleeve that are made of a material having low thermal conductivity at high temperature, with the base plate having one or more plate holes and a heat transfer plug held within a respective one of the plate holes. The wafers are arranged on the plugs, and the plugs are made of a material with high thermal conductivity at high temperatures. The plugs transfer heat from the heater element to the semiconductor wafers. A growth gas inlet is also included to provide gasses to grow epitaxial layers on the semiconductor wafers.

Reduced amounts of reactants are deposited on the susceptor embodiments disclosed herein, thereby reducing unwanted impurities during subsequent fabrication steps. The epitaxial layers can also be grown using less energy and consuming less source material because most of the heat from the reactor's heating element passes through the heat transfer plugs instead of heating the entire susceptor. The susceptor can also be manufactured using less complex processes because it does not need to be machined from a solid piece of graphite. Also, the heat transfer plugs can be more easily machined so their surface adjacent to the wafer has a convex or concave shape to compensate for any temperature non-uniformity.

These and other features and advantages of the invention will be apparent to those skilled in the art from the following detailed description, taken together with the accompanying drawings, in which:

BRIEF DESCRIPTION OF THE DRAWINGS

FIG. 5 is a plan view of a heat transfer plug used in the susceptor of FIG. 2;

FIG. 6a is a sectional view of the plug in FIG. 5, taken along section lines 6a-6a;

FIG. 6b is a sectional magnified view of a plug ridge shown in FIG. 6a; and

DETAILED DESCRIPTION OF THE INVENTION

Figure 1:
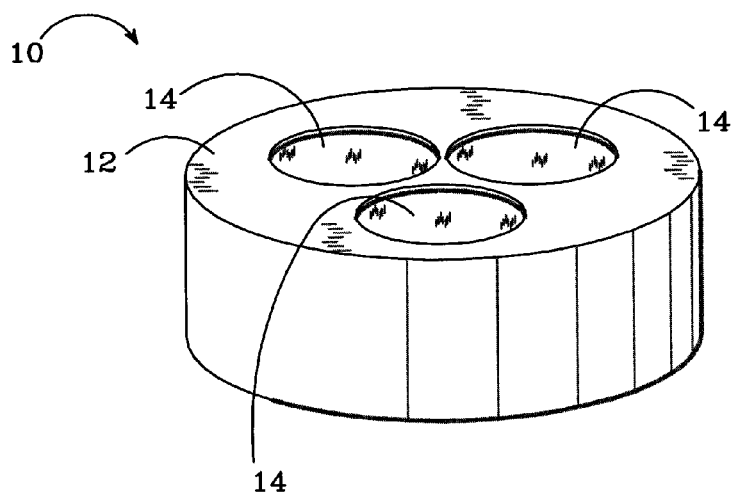
FIG. 1 is a perspective view of a prior art susceptor.
Figure 2:
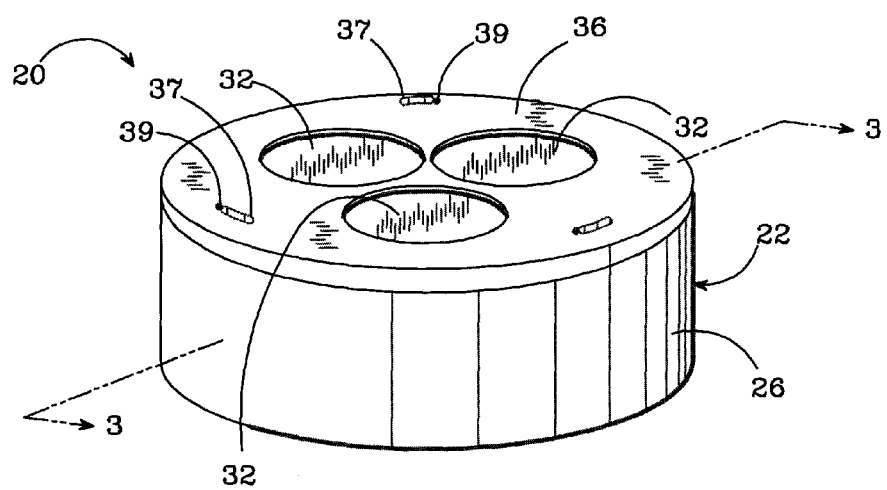
FIG. 2 is a perspective view of a susceptor according to the present invention.
Figure 3:
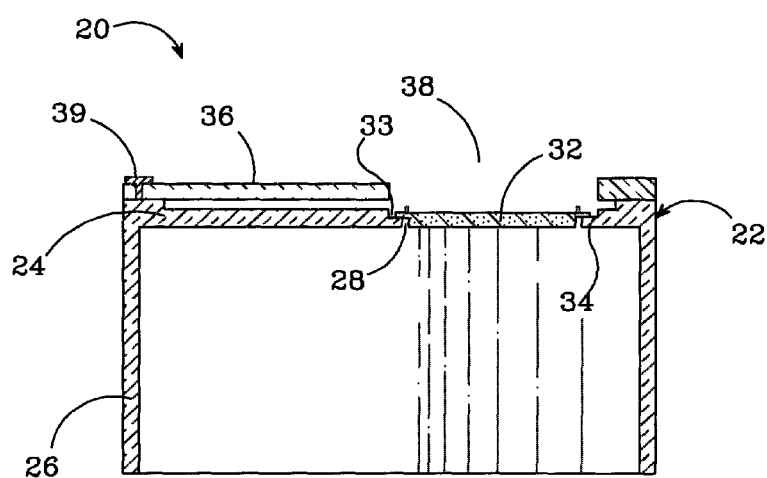
FIG. 3 is a sectional view of the susceptor in FIG. 2, taken along section lines 3-3.
Figure 4:
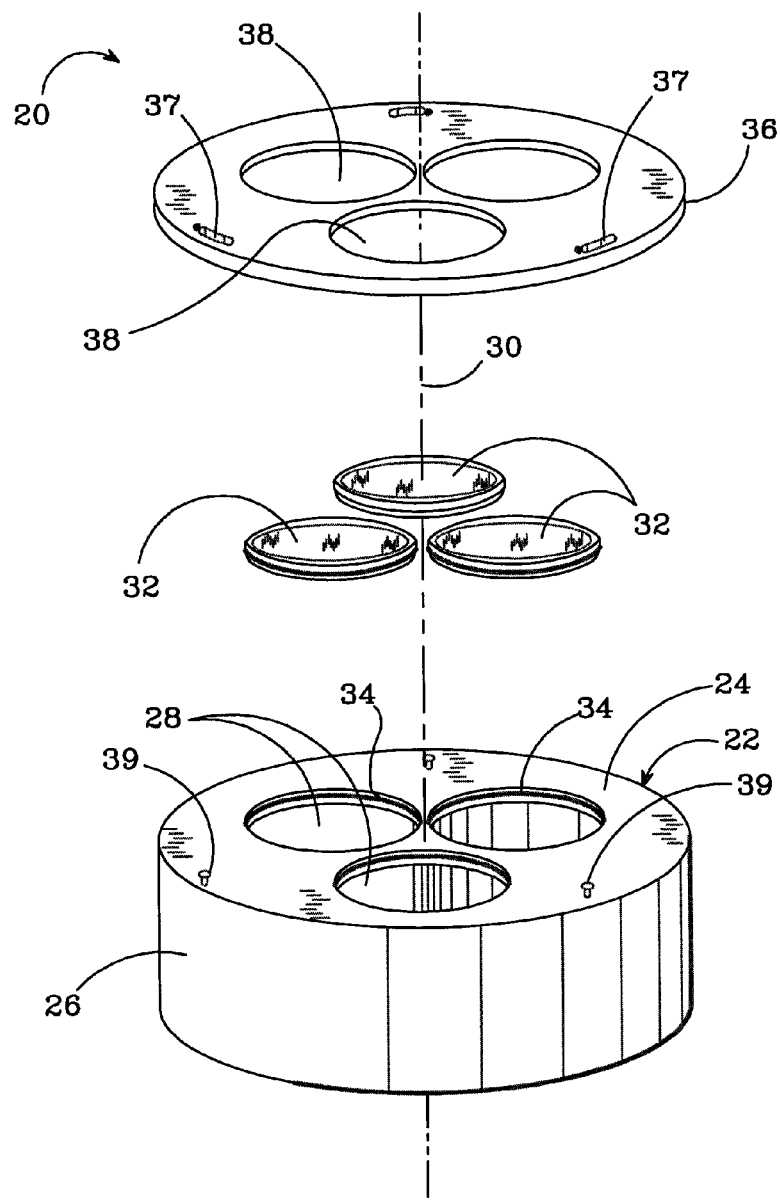
FIG. 4 is an exploded view of the susceptor in FIG. 2.

FIGS. 2 through 4 show a susceptor 20 according to the present invention, which can hold substrates or wafers for growth of epitaxial layers in an MOCVD reactor. The susceptor 20 can be mounted over the MOCVD reactor's heating element at the bottom of the reactor and can spin during the growth process.

The susceptor 20 includes a base structure 22 made of a base plate 24 and a cylindrical sleeve 26, which can be separate or manufactured as one structure. The base plate 24 has circular through holes 28 equally spaced around the susceptor's longitudinal axis 30. The number of through holes 28 can vary depending on the number of wafers that the susceptor 20 is designed to hold during growth.

The base structure 22 should be made of a rigid material that has a low thermal conductivity at high temperature so that it transmits less heat from the MOCVD reactor's heating element. It should also be made of a material that is reflective so that it reflects the heating element's radiative heat to further reduce the amount of heat it transmits. It should also have a low thermal expansion, so that its expansion matches that of the other susceptor components.

The base structure 22 can be made of many different materials such as boron nitride, fused quartz, aluminum nitride, or a ceramic, with the aluminum nitride and ceramic embodiments being coated with a material to reduce reacting with the source gasses. A preferred base structure 22 is made of boron nitride or fused quartz covered by boron nitride. These materials have high thermal conductivity at low temperature, low thermal conductivity at high temperature, and boron nitride is white, which enhances the structure's reflectivity. The base structure 22 is manufactured using known methods.

The base structure 22 can have many different dimensions. A suitable height for the cylindrical sleeve is approximately 2 inches and a suitable diameter is approximately 6.2 inches for a susceptor holding three 2 inch wafers. The base plate 24 also has a suitable diameter of approximately 6.2 inches, with the plate holes 28 equally spaced around the center of the base plate 24. A suitable diameter for the plate holes 28 is approximately 2.3 inches. The base plate 24 and the sleeve 26 can have many different thicknesses, with a suitable thickness being approximately 0.2 inches.

The susceptor 20 also includes heat transfer plugs 32, each of which fit within a respective plate hole 28. Semiconductor wafers are placed in contact with the plugs 32 during growth of the epitaxial layers and heat from the heating element should be efficiently conducted through the plugs 32, to the wafers. The plugs 32 are preferably made of a material having high thermal conductivity at high temperature and a dark color, both of which promote heat conduction. The preferred material for the plugs 32 is graphite or silicon carbide coated graphite. Each of the plugs 32 has an axial lip 33 around its outer surface, which rests on one of the axial ledges 34 on the inside surfaces of the through holes 28, such that a respective plug 32 rests within one of the holes 28.

A faceplate 36 can also be included that has holes 38 that align with the base structure's plate holes 28. The faceplate is arranged on the base structure's base plate 24 with the faceplate and base structure holes 38, 28 aligned. Only the plugs 32 are uncovered by the faceplate holes 38 and when a wafer is placed over the plug 32, only the wafer is uncovered by the holes 38.

The susceptor 20 works without the faceplate 36, but small amounts of reactants can deposit on the base structure 22 during epitaxial growth. The faceplate 36 provides a surface with a greater resistance to deposition of reaction species, with the surface also being easy to clean. It is preferably infrared transparent so that is does not absorb optical heat. It should also be made of a material that does not react with MOCVD source gasses. It can be made of materials such as quartz, pure silicon carbide, sapphire, silicon, coated graphite, graphite or tungsten, with a preferred material being quartz. Deposits can be cleaned from quartz by etching.

The faceplate 36 should have approximately the same diameter as the base plate 24 and its holes 38 should have the same or slightly smaller diameter as the plate holes 28. The faceplate 36 can have many different thicknesses with a suitable thickness being approximately 0.16 inches.

The susceptor 20 is designed to spin over the reactor's heating element during growth, so the face plate 36 should be mounted to the base structure 22. Different mounting methods can be used including, but not limited to, pins on the structure 22 mated with mounting holes, axial slots or J-slots in the faceplate 36. Alternatively, rotatable hooks can be included on the structure to mate with slots in the faceplate 36. In one embodiment, the hooks can be turned away from the center of the base plate 24 and the faceplate 36 is then placed over the base plate 24, with the stem of the hooks aligned with a respective slot. The hooks are then rotated so they are directed toward the center of the base plate 24. In the embodiment shown in FIGS. 2 through 4, the faceplate has axial slots 37 that mate with pins 39 on the structure 22. Each pin 39 has a head that passes through the widest section of one of the slots 37. The faceplate is then turned until the stem of each pin 39 is housed within the narrow section of its respective slot 37.

A space can be included between the faceplate 36 and the base structure 22 to limit the conducted heat due to contact between the faceplate 36 and the base plate 24. This is best accomplished by including a raised section on the surface of the base plate 24, around its edge.

The susceptor 20 can be used in MOCVD reactors where the susceptor is arranged at the bottom of the reactor with the circular plate facing up. Growth gasses enter the reactor from the top or sides and are deposited on the uncovered wafers that are held over the plugs 32.

This susceptor 20 promotes the transfer of heat from the reactor's heating element through the plugs 32, which reduces the amount of deposits on the surface of the base structure 22. Reduction of such deposits reduces the presence of unwanted compounds during fabrication of subsequent layers. The fabrication process requires less growth gas because most of the gasses are deposited on the wafer. The resulting semiconductor device has sharper interfaces and lower levels of unwanted impurities. This increases the yield and reproducibility of the epitaxial growth process.

This design also reduces the amount of power required to maintain the wafers at any given temperature compared to conventional susceptors. The heat primarily passes through the plugs only, instead of the entire susceptor as in the prior art. This allows for the use of smaller and less expensive components in the heater control assembly, increases the life of the heater assembly, and allows the growth of the epitaxial layers using less energy and source gasses.

FIGS. 5, 6a and 6b show one embodiment of a heat transfer plug 50, according to the present invention. Each plug 50 is substantially puck shaped and is designed to transfer heat from the reactor's heating element to a semiconductor wafer 52 (shown in FIGS. 6a and 6b) held in contact with the plug 50. The plug 50 can have a circular ridge 54 on its surface adjacent to the wafer 52, with only the ridge 54 contacting the wafer. This provides a small space between the wafer 52 and the plug 50 to promote even convective heating of the wafer. To further promote even heating of the wafer 52, the surface of the plug 50 adjacent to the wafer 52 can also have a convex, concave, or other shaped surface. The plug 50 should have a diameter that allows it to fit within one of the base plate through holes 28 and should have a size which allows for thermal expansion of the plug or base plate, with a suitable diameter being approximately 2.1 inches. Each plug 50 has a lip 56 (shown as reference number 33 in FIGS. 3 and 4) around its edge so the plug's top section has a slightly larger diameter than its lower section. As described above, each plug's lip 56 rests on a respective hole ledge 34.

The plug can have many different thicknesses, with a suitable thickness being approximately 0.33 inches. The ridge 54 can be many different sizes, with a suitable size being 0.002 inches high and 0.003 inches wide.

Prior to growth of the epitaxial layers, the wafers 52 and transfer plugs 50 are placed in the through holes 28 and the faceplate 36 is mounted to base structure 22 with the faceplate holes 38 aligned with the base structure's holes 28. The wafers 52 are uncovered by the faceplate 36 and when the plugs 50 are heated by the MOCVD's heating element, the wafers 52 are also heated. Growth gasses are fed into the reactor as the susceptor assembly 20 spins and epitaxial layers are grown on the wafers 52.

Figure 7:
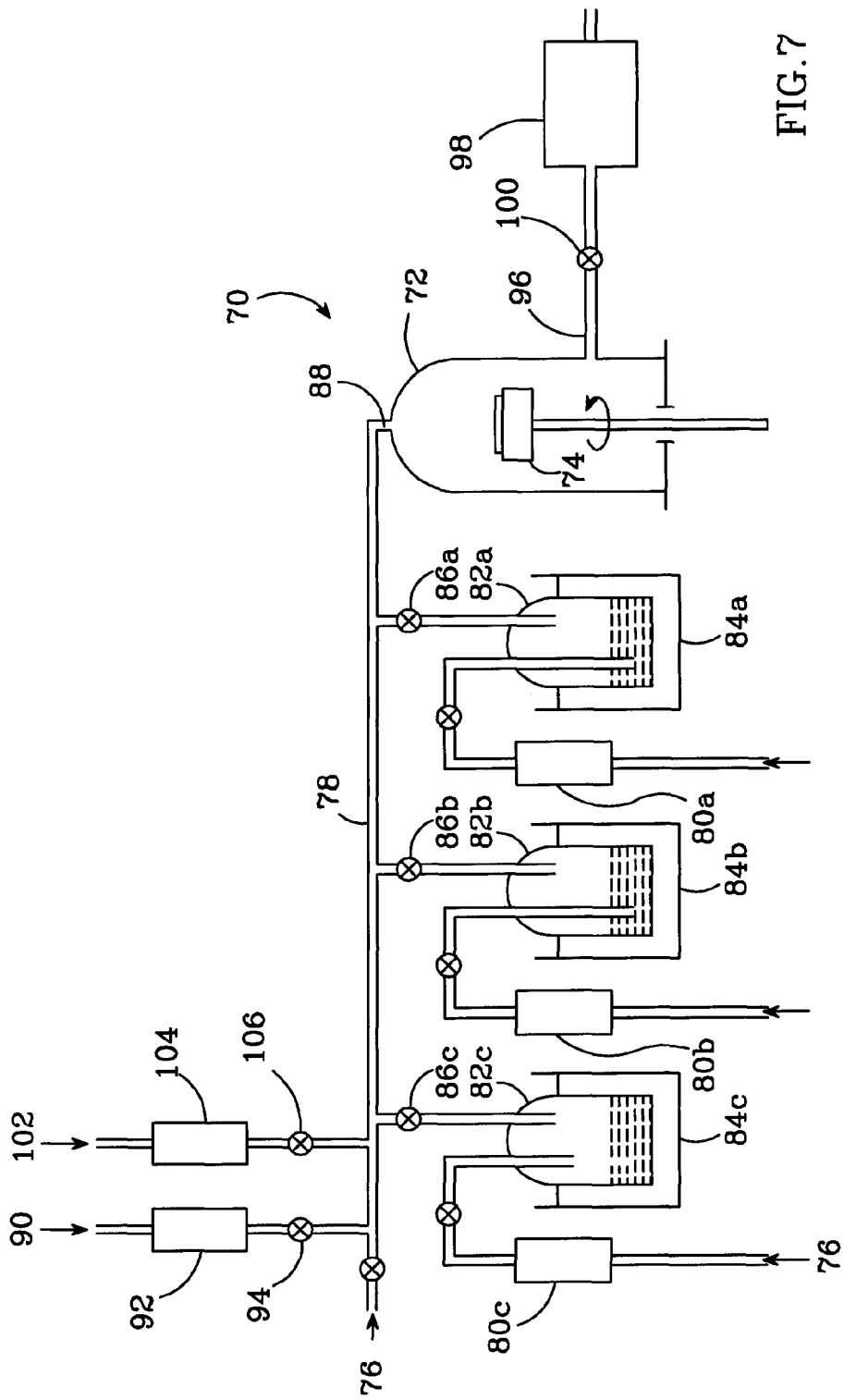
FIG. 7 is a simplified diagram of an MOCVD reactor using a susceptor according to the present invention.

FIG. 7 shows one embodiment of an MOCVD reactor 70 that can utilize a susceptor in accordance with the present invention for growing epitaxial layers on a wafer. The reactor 70 comprises a reaction chamber 72 having growth susceptor 74 that can spin. One or more wafers are mounted on the susceptor 74 for growth of epitaxial layers. During growth, the susceptor 74 is heated by a heater element (not shown) that is arranged within the susceptor 74, adjacent to the wafers. The heating element can be a variety of heating devices but is usually a radio frequency (RF) coil, resistance coil, or a strip heater.

A carrier gas 76 is supplied to a gas line 78, the carrier gas being an inert gas such as hydrogen or nitrogen. The carrier gas 76 is also supplied through mass flow controllers 80a, 80b, 80c to respective bubblers 82a, 82b, 82c. Bubbler 82a can have a growth compound, such as an alkylated compound having a methyl group, e.g. trimethyl gallium (TMG), trimethyl aluminum (TMA) or trimethyl indium (TMI). Bubblers 82b and 82c may also contain a similar methyl group compound to be able to grow an alloy of a Group III compound. The bubblers 82a, 82b, 82c are typically maintained at a predetermined temperature by constant temperature baths 84a, 84b, 84c to ensure a constant vapor pressure of the metal organic compound before it is carried to the reaction chamber 72 by the carrier gas 76.

The carrier gas 76, which passes through bubblers 82a, 82b, 82c, is mixed with the carrier gas 76 flowing within the gas line 78 by opening the desired combination of valves 86a, 86b, 86c. The mixed gas is then introduced into the reaction chamber 72 through a gas inlet port 88 formed at the upper end of the reaction chamber 72. A shower head inlet (not shown) can be included at the inlet port 88.

A nitrogen containing gas 90 such as ammonia, is supplied to the gas line 78 through a mass flow controller 92 and the flow of nitrogen containing gas is controlled by valve 94. If the carrier gas 76 is mixed with the nitrogen containing gas 90 and the TMG vapor within the gas line 78 and then introduced into the reaction chamber 72, the elements are present to grow gallium nitride on the wafer through thermal decomposition of the molecules present in the TMG and ammonia containing gas.

To dope alloys of gallium nitride on the wafer, one of the bubblers 82a, 82b, 82c not being used for the TMG is used for a dopant material, which is usually Magnesium (Mg) or Silicon (Si), but can be other material such as beryllium, calcium, zinc, or carbon. Bubbler 82b or 82c can be used for an alloy material such as boron aluminum, indium, phosphorous, arsenic or other materials. Once the dopant and alloy are selected and one of the valves 86a, 86b, 86c is opened to allow the dopant to flow into gas line 78 with the gallium and nitrogen containing gas 90, the growth of the doped layer of gallium nitride takes place on wafer.

The gas within the reaction chamber 72 can be purged through a gas purge line 96 connected to a pump 98 operable under hydraulic pressure. Further, a purge valve 100 allows gas pressure to build up or be bleed off from the reaction chamber 72.

The growth process is typically stopped by shutting off the gallium and dopant sources by closing valves 86a and 86b, and keeping the nitrogen containing gas and the carrier gas flowing. Alternatively, the reaction chamber 72 can be purged with a gas 102 that can be controlled through a mass flow controller 104 and valve 106. The purge is aided by opening valve 100 to allow the pump 98 to evacuate the reaction chamber 72 of excess growth gasses. Typically, the purge gas 102 is hydrogen, but can be other gasses. The wafer is then cooled by turning off power to the heater element.

Although the present invention has been described in considerable detail with reference to certain preferred configurations thereof, other versions are possible. The susceptors according to the present invention would work without a faceplate 36. As described above, susceptors according to the present invention can be used in many different reactors beyond MOCVD reactors and can be used in many different types of MOCVD reactors. The susceptors can be made of many different materials with many different dimensions. They can also be arranged differently with one different arrangement having the plugs 32 housed within the faceplate holes 38. Therefore, the spirit and scope of the appended claims should not be limited to the preferred versions in the specification.

We claim:

1. A susceptor for holding a plurality of semiconductor wafers in a reactor for growing epitaxial layers, comprising:
   a faceplate mounted on said susceptor, said faceplate having a plurality of faceplate holes and a surface substantially resistant to the deposition of reaction species, said faceplate covering said susceptor such that said semiconductor wafers are exposed through said faceplate holes to the deposition of reaction species and the remainder of said susceptor is substantially covered to reduce the deposition of reaction species on said susceptor;

a thermally conductive material at epitaxial growth temperatures in contact with said wafers to transfer heat to the semiconductor wafers such that said heat is conducted through said thermally conductive material primarily only to said wafers, said thermally conductive material comprising a circular ridge wherein only said ridge contacts said wafers to define a space between said thermally conductive material and said wafers to promote even heat transfer to said wafers, said thermally conductive material comprising a top section that is adjacent to one of said wafers, wherein said circular ridge is on said top section and is in contact with one of said wafers; and a low thermal conductivity material at epitaxial growth temperatures in areas not in direct contact with said wafers, said low thermal conductivity material including a raised section in contact with said faceplate, so that a space is included between said faceplate and said low thermal conductivity material, said low thermal conductivity material reducing the amount of heat transmitted from said reactor, said thermally conductive material placed on the low thermal conductivity material.

2. The susceptor of claim 1, wherein each of said faceplate holes is aligned with said thermally conductive material at epitaxial growth temperatures.

3. The susceptor of claim 1, wherein said faceplate is made of a material that is infrared transparent and cleanable by etching.

4. The susceptor of claim 1, wherein said faceplate is made of a material from the group consisting of quartz, silicon carbide, sapphire, silicon, coated graphite, graphite, and tungsten.

5. The susceptor of claim 1, wherein said thermally conductive material at epitaxial growth temperatures is made of graphite or silicon carbide coated graphite.

6. The susceptor of claim 1, wherein said low thermal conductivity material at epitaxial growth temperatures is made of a material from the group consisting of boron nitride, fused quartz, aluminum nitride and ceramic.

7. The susceptor of claim 1, wherein said low thermal conductivity material at epitaxial growth temperatures comprises a base structure, having a base plate and a cylindrical sleeve, said base plate having one or more plate holes.

8. The susceptor of claim 1, wherein said thermally conductive material at epitaxial growth temperatures comprises one or more heat transfer plugs, each of said one or more plugs housed within a respective hole of a base structure.

9. The susceptor of claim 1 wherein the thermally conductive material comprises the top section and a lower section, wherein the top section comprises a diameter larger than a diameter of the lower section.

10. The susceptor of claim 1 wherein the thermally conductive material comprises an axial lip and wherein the axial lip is placed on an axial ledge of the low thermal conductivity material.

11. The susceptor of claim 10, wherein the low thermal conductivity material comprises a through hole and the axial ledge is in an inside surface of the through hole.

12. A susceptor for holding a plurality of semiconductor wafers in a reactor for growing epitaxial layers, comprising:

a base structure having a plurality of holes;

a faceplate on said base structure, said faceplate comprising one or more holes that align with said base structure holes, said faceplate further providing a surface substantially resistant to the deposition of reaction species;

one or more heat transfer plugs housed in said base structure holes, said plugs comprising a thermally conductive material at epitaxial growth temperatures, said plugs further comprising a circular ridge wherein only said ridge is in contact with said wafers to define a space between said plugs and said wafers to promote even heat transfer to said wafers, wherein each heat transfer plug comprises a top section that is adjacent to one of said wafers, wherein said circular ridge is on said top section and is in contact with one of said wafers;

a low thermal conductivity material at epitaxial growth temperatures, said low thermal conductivity material including a raised section in contact with said faceplate, so that a space is included between said faceplate and said low thermal conductivity material, reducing the amount of heat transmitted from said reactor, wherein said base structure comprises said low thermal conductivity material, said one or more heat transfer plugs placed on the low thermal conductivity material; and wherein said susceptor is adapted to rotate about a longitudinal axis as reaction species are deposited.

13. The susceptor of claim 12, wherein said faceplate is made of a material that is infrared transparent and cleanable by etching.

14. The susceptor of claim 12 wherein each plug comprises the top section and a lower section, wherein the top section comprises a diameter larger than a diameter of the lower section.

15. The susceptor of claim 12 wherein each plug comprises an axial lip and wherein the axial lip is placed on an axial ledge of the low thermal conductivity material.

16. The susceptor of claim 15, wherein the low thermal conductivity material comprises a through hole and the axial ledge is in an inside surface of the through hole.

* * * * *